US008159023B2

(12) United States Patent
Ono et al.

(10) Patent No.: US 8,159,023 B2
(45) Date of Patent: Apr. 17, 2012

(54) SEMICONDUCTOR DEVICE

(75) Inventors: Syotaro Ono, Yokohama (JP); Wataru Saito, Kawasaki (JP); Nana Hatano, Kawasaki (JP); Hiroshi Ohta, Himeji (JP); Miho Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 49 days.

(21) Appl. No.: 12/692,527

(22) Filed: Jan. 22, 2010

(65) Prior Publication Data

US 2010/0187604 A1 Jul. 29, 2010

(30) Foreign Application Priority Data

Jan. 23, 2009 (JP) .................................. 2009-012610

(51) Int. Cl.
*H01L 29/00* (2006.01)
(52) U.S. Cl. ................ 257/328; 257/335; 257/E29.001; 257/107
(58) Field of Classification Search .................. 257/335, 257/338, E29.001, 107
See application file for complete search history.

(56) References Cited

U.S. PATENT DOCUMENTS 7,790,520 B2 * 9/2010 Saggio et al. ................. 438/140
2008/0246079 A1 * 10/2008 Saito et al. .................... 257/328

FOREIGN PATENT DOCUMENTS

| JP | 2004-14554 A | 1/2004 |
| JP | 2004-72068 A | 3/2004 |
| JP | 2007-12801 A | 1/2007 |
| WO | WO-2007/122646 | 11/2007 |

OTHER PUBLICATIONS

U.S. Appl. No. 12/620,045.
Fujihira, T. "Theory of Semiconductor Superjunction Devices" Jpn. J. Appl. Phys. vol. 36 (1997) pp. 6254-6262.
Lee, S. et al. "Investigation of Gate Oscillation of Power MOSFETs Induced by Avalamche Mode Operation" Proceedings of the 19th International Symposium on Power Semiconductor Devices & ICs, May 27-30, 2007 Jeju, Korea, pp. 113-116.
Chinese Office Action dated Aug. 31, 2011, filed in Chinese counterpart Application No. 20100004023.1, 8 pages.

* cited by examiner

*Primary Examiner* — Long Pham
(74) *Attorney, Agent, or Firm* — Patterson & Sheridan, LLP

(57) ABSTRACT

A semiconductor device includes a semiconductor substrate of a first conductivity type, a first semiconductor region of the first conductivity type on the semiconductor substrate, and a plurality of second semiconductor regions of a second conductivity type disposed separately in the first semiconductor region. A difference between a charge quantity expressed by an integral value of a net activated doping concentration in the second semiconductor regions in the surface direction of the semiconductor substrate and a charge quantity expressed by an integral value of a net activated doping concentration in the first semiconductor region in the surface direction of the semiconductor substrate is always a positive quantity and becomes larger from the depth of the first junction plane to a depth of a second junction plane on an opposite side from the first junction plane.

10 Claims, 6 Drawing Sheets

SEMICONDUCTOR DEVICE

CROSS-REFERENCE TO RELATED APPLICATION

This application is based upon and claims the benefit of priority from the prior Japanese Patent Application No. 2009-012610, filed on Jan. 23, 2009; the entire contents of which are incorporated herein by reference.

BACKGROUND OF THE INVENTION

1. Field of the Invention

The present invention relates to a semiconductor device, and more particularly, to a power semiconductor device that is used in the power electronics field, such as various kinds of switching power supplies.

2. Related Art

A semiconductor device such as a MOS field effect transistor (hereinafter referred to as "MOSFET") or an insulating-gate bipolar transistor (hereinafter referred to as "IGBT") has high-speed switching properties and a reverse-direction blocking voltage of several dozen to several hundred voltage (hereinafter referred as to the "withstand voltage"). Therefore, such semiconductor devices are widely used in a technical field regarding control systems, such as power converters for household appliances, communication devices and vehicle motors. In order to achieve downsizing, high efficiency and low power consumption of power systems using such semiconductor devices, it is necessary to lower the resistance (hereinafter referred to as the "ON resistance") in the ON state of the semiconductor devices included in the power system. A MOSFET and an IGBT are strongly required to increase a withstand voltage and lower the ON resistance.

When a high voltage is applied to the semiconductor device in an OFF state, the drift region is normally depleted, and the high voltage is held. Since the semiconductor device such as the MOSFET or IGBT has a drift region of relatively low doping concentration to obtain a high withstand voltage, the resistance becomes higher and a ratio of the drift resistance to the ON resistance of a chip increases. As a result, the ON resistance also becomes higher. Therefore, in such semiconductor devices, there is a "trade-off" relationship between the withstand voltage and the ON resistance, and there is a limitation depending on the materials.

As the structures to reduce the drift resistance, a super junction structure has been known (see "Theory of semiconductor super junction devices" (T. Fujihira, Jpn. J. Appl. Phys., Vol. 36 (1997), p.p. 6254-6262). In the super junction structure, p-type semiconductor layers and n-type semiconductor layers are alternately disposed in a direction perpendicular to the current path in the drift region.

In an ordinary semiconductor device, when a high voltage is applied to the drain electrode, the depletion layer spreads from a pn junction plane between a p-type base region connected to a source electrode and an n-type drift region. As a result, when the intensity of the electric field at the pn junction plane reaches a critical electric field, an avalanche breakdown occurs. Therefore, the withstand voltage of the ordinary semiconductor device is determined by the doping concentration of the n-type drift region and the depletion layer length.

On the other hand, in the super junction structure, the depletion layer spreads not only from the pn junction plane between the p-type base region and the n-type drift region but also from the pn junctions between the p-type semiconductor layers and the n-type semiconductor layers in the drift region. Therefore, the electric field concentration on the pn junction plane between the p-type base region and the n-type drift region is relaxed, and the electric field in the entire drift region becomes higher. As a result, even if the doping concentration of the n-type semiconductor layers becomes higher than the doping concentration in the drift region of the ordinary semiconductor device, a high withstand voltage is achieved. Furthermore, when the semiconductor device is in the ON state, a current flows in the high-concentration n-type semiconductor layers. Therefore, the ON resistance of the super junction structure can be set to approximately ⅕ of the ON resistance in the ordinary semiconductor device having substantially the same withstand voltage as that of the super junction structure.

However, there is still a demand for further reducing the ON resistance in the super junction structure. In order to further reduce the ON resistance in the super junction structure, it is necessary to increase the doping concentration in the n-type semiconductor layers. In such a case, the n-type semiconductor layers need to be depleted so as to maintain the withstand voltage. Therefore, it is necessary to reduce the widths of the n-type semiconductor layers and the p-type semiconductor layers. That is, it is necessary to increase the aspect ratio of each of the semiconductor layers.

As the methods for forming the super junction structure, the following methods have been known. For example, there is a method in which trenches are formed by reactive ion etching (hereinafter referred to as "RIE") on the surface of an n-type epitaxial layer, and then p-type layers are epitaxially grown (see JP-A No. 2007-12801 (Kokai)). Furthermore, there is a method for selectively forming n-type and p-type buried layers on a high-resistance epitaxial layer through ion implantation and diffusion, for stacking high-resistance epitaxial layers, and for forming n-type and p-type buried layers by ion implantation and diffusion in the same manner as the formation of the lower layers, the method being repeated multiple times (see JP-A No. 2004-14554 (Kokai)).

It is very difficult to implement the method disclosed in JP-A No. 2007-12801 (Kokai) in that a high-quality silicon is epitaxially grown inside the trenches at a high aspect ratio, and impurities have to be implanted at high controllability.

According to the method disclosed in JP-A No. 2004-14554 (Kokai), higher controllability is achieved, though the number of manufacturing steps such as ion implantations and epitaxial growths is increased. Therefore, the method is well used as the process for forming the super junction structure and has been commercialized.

However, according to the method disclosed in JP-A No. 2004-14554 (Kokai), it is necessary to adjust the thickness of each high-resistance epitaxial layer to such a thickness that the n-type and p-type diffusion layers located above and below can be connected at high concentration. Therefore, in order to achieve a high aspect ratio, it is necessary to reduce the distance between adjacent p-type and n-type diffusion layers. In doing so, however, the overlapped and cancelled-out doping concentration increases, thereby reducing a process margin.

In order to reduce the cancelled-out doping concentration, it is conceivable to reduce the diffusion length. In this case, however, the thickness of each epitaxial layer needs to be reduced so that upper and lower diffusion layers are not contacted at high concentration.

However, the total thickness of the drift region is substantially uniform. Therefore, if each of the epitaxial layers is made thinner by reducing the diffusion length, the number of manufacturing steps required for the ion implantations and the epitaxial growths increases, thereby rising the production costs.

Meanwhile, the super junction structure has a different drift region from the drift region of an ordinary double-diffusion MOS (hereinafter referred to as "DMOS") structure. Therefore, the trade-off relationship between the withstand voltage and the ON resistance is improved. The profile of the super junction structure is a unique profile of the drift region, and depends on the p-type and n-type pillar profiles. Therefore, the profile has the electric field distribution greatly different from the electric field distribution of the DMOS. As a result, the super junction structure that the DMOS does not have has to be suitably designed in order to obtain the static properties ordinarily achieved by a switching device such as a DMOS, and also to improve an avalanche capability and reliability.

There is another known method, in which the widths or doping concentration of n-type semiconductor layers and p-type semiconductor layers of pn structures disposed in parallel is controlled to make the doping concentration higher in a p-type region on the surface-side than the doping concentration in the adjacent n-type region, and to make the doping concentration lower in the p-type region on the bottom-side than the doping concentration in the n-type region, thereby improving the electric field distributions at the pn structure portions and the avalanche capability (see JP-A No. 2004-72068 (Kokai)). The method disclosed in JP-A No. 2004-72068 (Kokai) has to design the profile of the pn structures in the drift region in order to maintain the switching properties and the device reliability, in addition to improvement of the avalanche capability. For example, the method disclosed in JP-A No. 2004-72068 (Kokai) designs the profile for securing the device reliablity by providing a peak point of the electric field in the middle of the drift region and by setting the avalanche point away from the gate electrode.

However, if the peak point of the electric field is provided in the middle of the drift region by the method disclosed in JP-A No. 2004-72068 (Kokai), the gate potential varies via the gate oxide film due to the avalanche breakdown caused in the vicinity of the gate electrode, and a feedback current flows through the gate electrode. As a result, the avalanche capability might be adversely affected (see S.-C. Lee, K.-H. Oh, Jang, J.-G. Lee, S.-S. Kim, and C.-M. Yun, "Investigation of Gate Oscillation of Power MOSFETs Induced by Avalanche Mode Operation", Power Semiconductor Devices and IC's, 2007 IEEE International Symposium on 27-30 May, 2006, p.p. 113-116).

In the other document of "Investigation of Gate Oscillation of Power MOSFETs Induced by Avalanche Mode Operation", the influence on the avalanche capability is described. However, according to the method disclosed in JP-A No. 2004-72068 (Kokai), the switching properties are also affected, because there is a high-electric-field portion in the vicinity of the gate electrode. As a result, the feedback current flows through the gate electrode, thereby causing switching noise.

According to the method disclosed in JP-A No. 2004-72068 (Kokai), when the feedback current flowing through the gate electrode increases, the reliability of the gate insulating film becomes lower. For example, when carriers generated by the avalanche breakdown are trapped in the gate insulating film, the threshold voltage of devices varies, and the properties (the threshold voltage and the drain-source leakage) also vary.

Furthermore, according to the method disclosed in JP-A No. 2004-72068 (Kokai), the spread of the depletion layer depending on the drain-source voltage varies due to the profiles of the pn structures. As a result, the change in capacity at the time of switching operation also varies.

As above, according to conventional super junction structures, it is difficult to improve the avalanche capability and the device reliability at the same time.

BRIEF SUMMARY OF THE INVENTION

According to a first aspect of the present invention, there is provided a semiconductor device comprising:
a semiconductor substrate of a first conductivity type;
a first semiconductor region of the first conductivity type on the semiconductor substrate; and
a plurality of second semiconductor regions of a second conductivity type disposed separately in the first semiconductor region in a surface direction of the semiconductor substrate, wherein
a difference between a charge quantity expressed by an integral value of a net activated doping concentration in the second semiconductor regions in the surface direction of the semiconductor substrate and a charge quantity expressed by an integral value of a net activated doping concentration in the first semiconductor region in the surface direction of the semiconductor substrate is always a positive quantity and becomes larger from the depth of the first junction plane to a depth of a second junction plane on an opposite side from the first junction plane of the junction planes at both ends in each second semiconductor region.

According to a second aspect of the present invention, there is provided a semiconductor device comprising:
a semiconductor device comprising:
a semiconductor substrate of a first conductivity type;
a first semiconductor region of the first conductivity type on the semiconductor substrate; and
a plurality of second semiconductor regions of a second conductivity type disposed separately in the first semiconductor region in a surface direction of the semiconductor substrate, wherein
a difference between a charge quantity expressed by an integral value of a net activated doping concentration in the second semiconductor regions in the surface direction of the semiconductor substrate and a charge quantity expressed by an integral value of a net activated doping concentration in the first semiconductor region in the surface direction of the semiconductor substrate is substantially 0 in the vicinity of a depth of a first junction plane on a side of the semiconductor substrate of junction planes at both ends in each second semiconductor region, is always a positive quantity, and becomes larger from the depth of the first junction plane to a depth of a second junction plane on an opposite side from the first junction plane of junction planes at both ends in each second semiconductor region.

DETAILED DESCRIPTION OF THE INVENTION

An embodiment of the present invention will be described with reference to the accompanying drawings. It should be noted that the following embodiment is merely an example, and therefore, does not limit the scope of the invention.

First, in the following embodiment, an integral value of the net activated doping concentration in a semiconductor region in a direction (hereinafter referred to as the "surface direction") parallel to a semiconductor substrate is defined as the "charge quantity".

Figure 1:
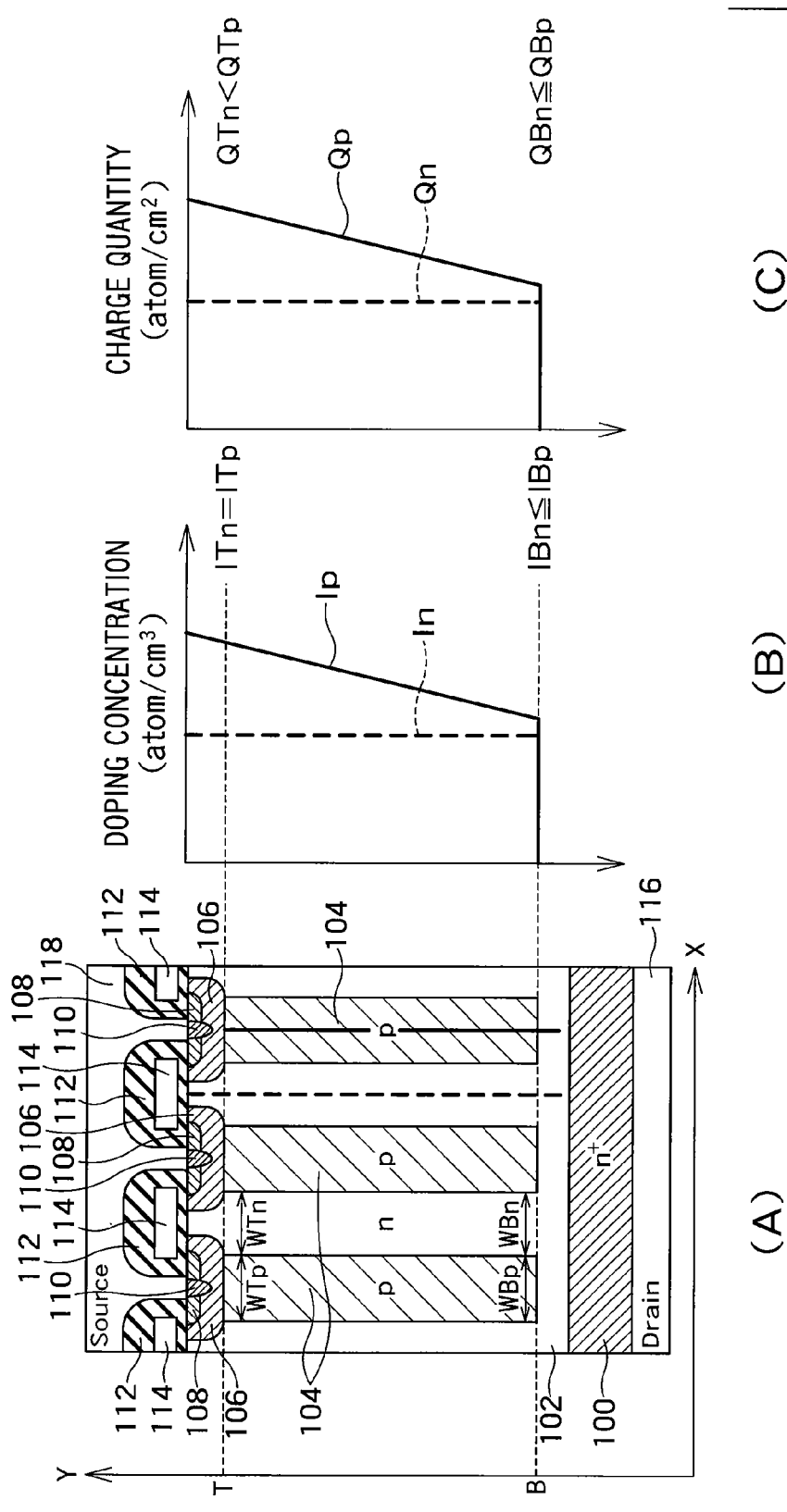
FIG. 1 is a cross-sectional view (see FIG. 1(A)) of the structure of the semiconductor device according to the embodiment of the present invention, a graph (see FIG. 1(B)) showing the relationship between the net doping concentration I (atoms/cm$^3$) and the depth of the semiconductor device, and a graph (see FIG. 1(C)) showing the relationship between the net charge quantity Q (atoms/cm$^2$) and the depth of the semiconductor device.

Referring now to FIG. 1, the structure of a semiconductor device according to the embodiment of the present invention will be described. In FIG. 1, FIG. 1(A) is a cross-sectional view of the semiconductor device according to the embodiment of the present invention, FIG. 1(B) is a graph showing the relationship between the net doping concentration I (atoms/cm$^3$) and the depth of the semiconductor substrate, and FIG. 1(C) is a graph showing the relationship between the net charge quantity Q (atoms/cm$^2$) and the depth of the semiconductor substrate.

As shown in FIG. 1(A), the semiconductor device includes a semiconductor substrate 100 which is formed by using silicon and n-type (hereinafter referred to as the "first conductivity type") impurities buried therein, a first semiconductor region 102 of the first conductivity type formed on the semiconductor substrate 100, second semiconductor regions 104 of p-type (hereinafter referred to as the "second conductivity type") formed separately in the first semiconductor region 102 in a surface direction (the X-direction) of the semiconductor substrate 100, third semiconductor regions 106 of the second conductivity type connected to the second semiconductor regions 104, fourth semiconductor regions 108 of the first conductivity type formed on the third semiconductor regions 106, fifth semiconductor regions 110 of the second conductivity type formed on the third semiconductor regions 106, and gate electrodes 114 formed above the first semiconductor region 102 and the third semiconductor regions 106, and above a partial surface of the fourth semiconductor regions 108 via insulating films 112. Furthermore, the semiconductor device according to the embodiment of the present invention also includes a first main electrode 116 to serve as a drain electrode formed on a surface not contacted with the first semiconductor region 102 on the semiconductor substrate 100, and a second main electrode 118 which serves as a source electrode formed on the insulating films 112 and is connected to a partial surface of the fourth semiconductor regions 108 and a whole surface of the fifth semiconductor regions 110.

The width Wn of the first semiconductor region 102 in the X-direction is WBn at the depth of the junction plane (hereinafter referred to as the "first junction plane B") between the first semiconductor region 102 and each of the second semiconductor regions 104 on the side (drain electrode side) of the semiconductor substrate 100, and WTn at the depth of the junction plane (hereinafter referred to as the "second junction plane T") on the opposite side (source electrode side) from the first junction plane B. The width Wn is constant, i.e. WBn=WTn, from the depth direction of the first junction plane B to the depth direction of the second junction plane T in a direction (hereinafter referred to as the "perpendicular direction") (the Y-direction) perpendicular to the surface of the semiconductor substrate 100. That is, the second junction plane T is between each of the second semiconductor regions 104 and each of the third semiconductor regions 106 which are base layers of the second conductivity type.

The width Wp of each of the second semiconductor region 104 in the X-direction is WBp at the depth of the first junction plane B, WTp at the depth of the second junction plane T. The width Wp is constant, i.e. WBp=WTp, from the depth direction of the first junction plane B to the depth direction of the second junction plane T, in the perpendicular direction (the Y-direction) of the semiconductor substrate 100.

As shown in FIG. 1(B), the difference between the doping concentration in the second semiconductor regions 104 and the doping concentrations in the first semiconductor region 102 is 0 or larger at the depth of the first junction plane B, and becomes larger from the depth of the first junction plane B to the depth of the second junction plane T in the perpendicular direction (the Y-direction) of the semiconductor substrate 100.

As a result, as shown in FIG. 1(C), the difference ΔQ between the charge quantity Qp of the second semiconductor regions 104 and the charge quantity Qn of the first semiconductor region 102 is 0 or larger (ΔQB≧0) at the depth of the first junction plane B, and becomes larger from the depth of the first junction plane B to the depth of the second junction plane T in the perpendicular direction (the Y-direction) of the semiconductor substrate 100 (QBn≦QBp, QTn<QTp, ΔQB<ΔQT).

Figure 2:
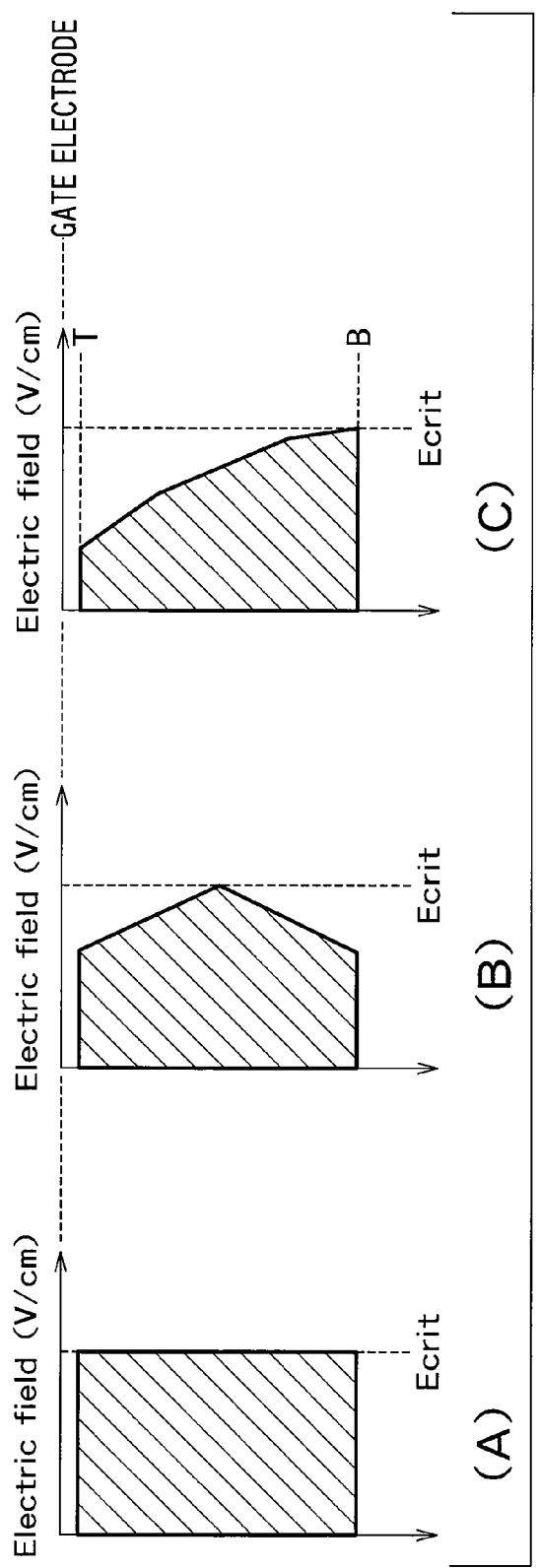
FIG. 2 is graphs showing the electric field distributions in conventional semiconductor devices (see FIGS. 2(A) and (B)), and in the semiconductor device shown in FIG. 1(A) (see FIG. 2(C)).
Figure 3:
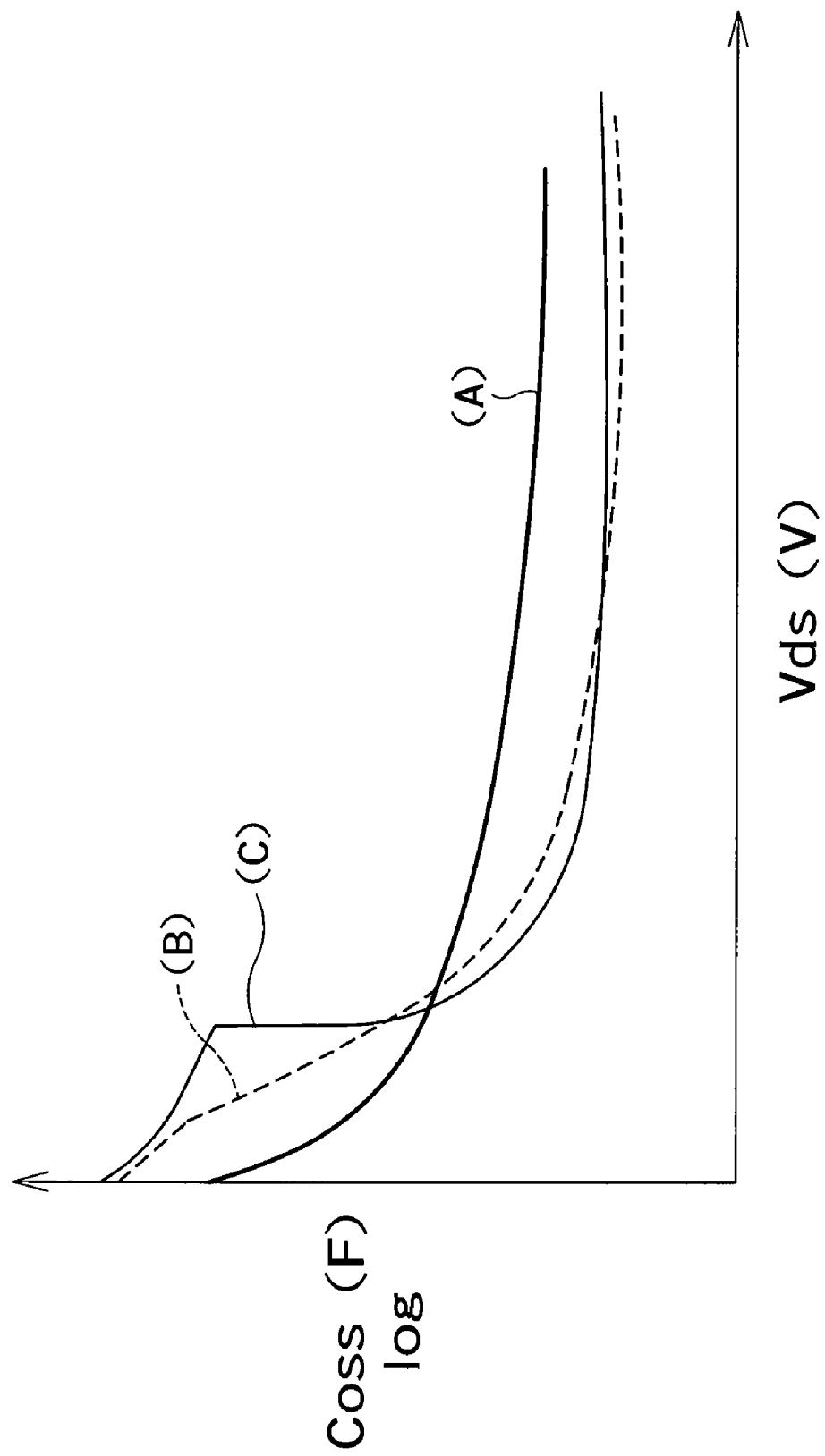
FIG. 3 is curves showing the relationships between the output capacity and the drain-source voltage in the conventional semiconductor devices (see curves (A) and (B)), and in the semiconductor device shown in FIG. 1(A) (see curve (C)).

Referring now to FIGS. 2 and 3, the characteristics of the semiconductor device shown in FIG. 1 will be described. In FIG. 2, FIGS. 2(A) and 2(B) are graphs showing the electric field distributions in conventional semiconductor devices, and FIG. 2(C) is a graph showing the electric field distributions in the semiconductor device shown in FIG. 1. In FIG. 3, curves (A) and (B) are curves showing the relationships between the output capacity and the drain-source voltage in the conventional semiconductor devices, and a vurve (C) is a curve showing the relationships between the output capacity and the drain-source voltage in the semiconductor device shown in FIG. 1.

FIG. 2(A) shows the electric field distribution in a conventional semiconductor device in which p-type semiconductor regions and n-type semiconductor regions are formed to have the same width and the same doping concentration. As shown in FIG. 2(A), since the width and the doping concentration of the p-type and the n-type semiconductor regions are constant, respectively, the electric field distribution becomes a rectangular shape. As a result, the electric field peak at the time of the avalanche breakdown appears at a position very close to the gate electrode of the pn structure.

FIG. 2(B) shows the electric field distribution in a semiconductor device according to JP-A No. 2004-72068 (Kokai). As shown in FIG. 2(B), in the semiconductor device according to JP-A No. 2004-72068 (Kokai), the electric field peak at the time of the avalanche breakdown appears in the neighborhood of the center point in the depth direction of the pn structure.

FIG. 2(C) shows the electric field distribution in the semiconductor device shown in FIG. 1. As shown in FIG. 2(C), the difference in the doping concentration between the second semiconductor regions 104 and the first semiconductor region 102 is 0 or larger at the depth of the first junction plane B, and becomes greater in the direction from the depth of the first junction plane B to the depth of the second junction plane T. As a result, the electric field becomes higher at the depth of the first junction plane B, and becomes lower at the depth of the second unction plane T.

As shown in FIG. 2(A) through FIG. 2(C), as compared with the conventional semiconductor device, the semiconductor device shown in FIG. 1 has the peak point of the electric field appears at the depth direction of the first junction plane B and the avalanche point far away from the gate electrode 114. Therefore, the avalanche capability can be improved in the semiconductor device shown in FIG. 1, and the feedback current flowing through the gate electrode 114 at the time of switching operation is suppressed, thereby reducing the noise caused at the time of switching operation.

FIG. 3(A) is a curve showing a relationship between a drain-source voltage and an output capacity of the conventional semiconductor device having the DMOS structure. FIG. 3(B) is a curve showing a relationship between the drain-source voltage and the output capacity of the semiconductor device according to JP-A No. 2004-72068 (Kokai). FIG. 3(C) is a curve showing a relationship between the drain-source voltage and the output capacity of the semiconductor device shown in FIG. 1. As shown in FIG. 3(A) through 3(C), in the semiconductor device shown in FIG. 1, the change in the output capacity depending on the drain-source voltage is sharper than the change in the conventional semiconductor devices. As a result, the charging and discharging time of the acceptors and donors in the drift region at the time of switching operation are shortened. Therefore, the switching time is also shortened. Particularly, the reduction of the switching time is an essential feature in a high-frequency operation of a circuit including a semiconductor device. Since the change of the output capacity is sharp, the recovery rate of the embedded pn diode becomes higher (that is, the reverse recovery time trr becomes shorter). Therefore, the reverse recovery properties of the embedded pn diode also improve.

Figure 4:
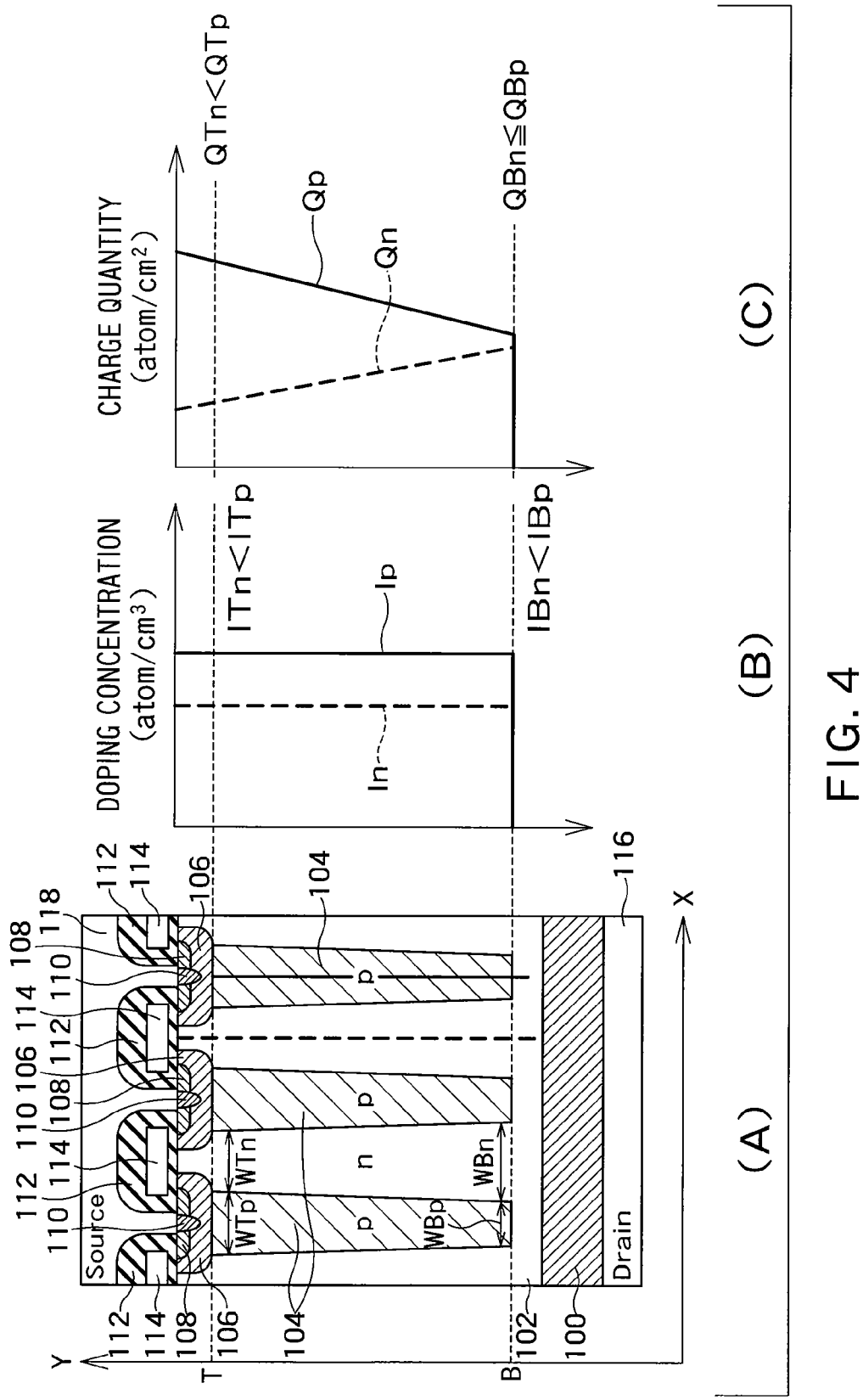
FIG. 4 is a cross-sectional view (see FIG. 4(A)) of the structure of the semiconductor device according to the first modification of the embodiment of the present invention, a graph (see FIG. 4(B)) showing the relationship between the net activated doping concentration I (atoms/cm$^3$) and the depth of the semiconductor device, and a graph (see FIG. 4(C)) showing the relationship between the net charge quantity Q (atoms/cm$^2$) and the depth of the semiconductor device.

Now, a first modification of the embodiment of the present invention will be described with reference to FIG. 4. In FIG. 4, FIG. 4(A) is a cross-sectional view of the structure of the semiconductor device according to the first modification of the embodiment of the present invention, FIG. 4(B) is a graph showing the relationship between the net activated doping concentration I (atoms/cm$^3$) and the depth of the semiconductor, and FIG. 4(C) is a graph showing the relationship between the net charge quantity Q (atoms/cm$^2$) and the depth of the semiconductor.

As shown in FIG. 4(A), the width Wn of the first semiconductor region 102 in the X-direction is WBn at the depth of the first junction plane B between the first semiconductor region 102 and each of the second semiconductor regions 104 on the side (drain electrode side) of the semiconductor substrate 100, and WTn at the depth of the second junction plane T on the opposite side (source electrode side) from the first junction plane B. The width Wn becomes smaller from the depth of the first junction plane B to the depth of the second junction plane T in the perpendicular direction (the Y-direction) of the semiconductor substrate 100 (WBn>WTn).

The width Wp of each second semiconductor region 104 in the X-direction is WBp at the depth of the first junction plane B, and WTp at the depth of the second junction plane T. The width Wp becomes greater from the depth of the first junction plane B to the depth of the second junction plane T in the perpendicular direction (the Y-direction) of the semiconductor substrate 100 (WBp<WTp).

As shown in FIG. 4(B), the difference ΔI between the doping concentration Ip in the second semiconductor regions 104 and the doping concentration In in the first semiconductor region 102 is larger than 0 and constant from the depth of the first junction plane B to the depth of the second junction plane T in the perpendicular direction (the Y-direction) of the semiconductor substrate 100 (0<ΔIB=ΔIT).

As a result, as shown in FIG. 4(C), the difference ΔQ between the charge quantity Qp of the second semiconductor regions 104 and the charge quantity Qn of the first semiconductor region 102 is 0 or larger (ΔQB≧0) at the depth of the first junction plane B, and becomes larger from the depth of the first junction plane B to the depth of the second junction plane T in the perpendicular direction (the Y-direction) of the semiconductor substrate 100 (QBn≦QBp, QTn<QTp, ΔQB<ΔQT).

An example of a method for manufacturing the semiconductor device shown in FIG. 4(A) will be described below. Trenches are formed in the first semiconductor region 102 by selective RIE using a photolithography technique. At this step, each of the trenches is designed to slant so that a width of each trench becomes smaller from the depth of the second junction plane T to the depth of the first junction plane B in the perpendicular direction (the Y-direction) of the semiconductor substrate 100. Then, the second semiconductor regions 104 are epitaxially grown. Then, the upper MOSFET regions are formed.

Figure 5:
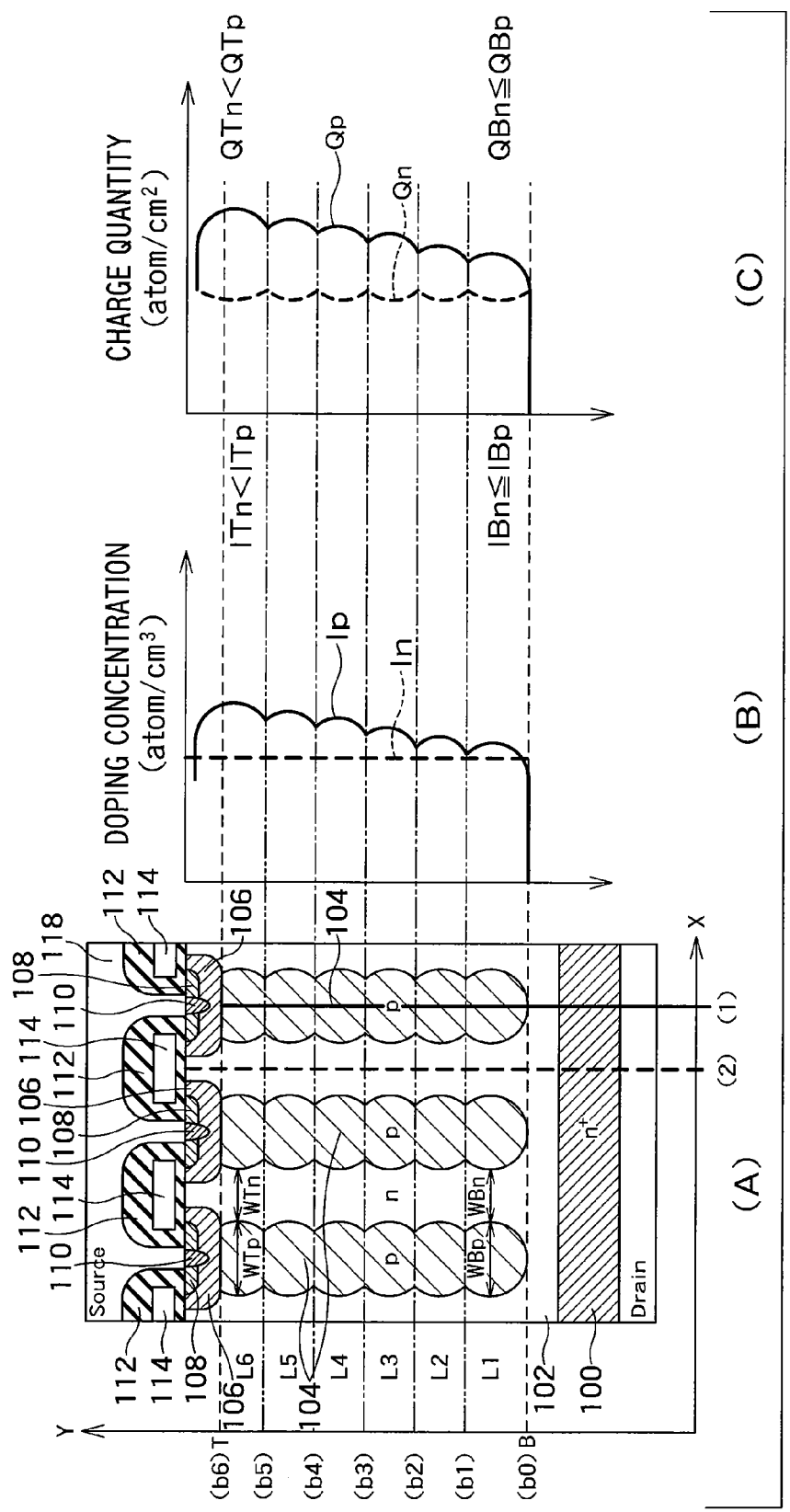
FIG. 5 is a cross-sectional view (see FIG. 5(A)) of the structure of the semiconductor device according to the second modification of the embodiment of the present invention, a graph (see FIG. 5(B)) showing the relationship between the net doping concentration I (atoms/cm$^3$) and the depth of the semiconductor device, and a graph (see FIG. 5(C)) showing the relationship between the net charge quantity Q (atoms/cm$^2$) and the depth of the semiconductor device.

Now, a second modification of the embodiment of the present invention will be described with reference to FIG. 5. In FIG. 5, FIG. 5(A) is a cross-sectional view of the structure of the semiconductor device according to the second modification the second modification of the embodiment of the present invention, FIG. 5(B) is a graph showing the relationship between the net doping concentration I (atoms/cm$^3$) and the depth of the semiconductor substrate, and FIG. 5(C) is a graph showing the relationship between the net charge quantity Q (atoms/cm$^2$) and the depth of the semiconductor substrate.

As shown in FIG. 5(A), each of the first and second semiconductor regions 102 and 104 has a stack structure formed with unit layers (layers L1 through L6) having the same shapes. The activated doping concentration at the center portion (indicated by the solid line (1)) of each of the second semiconductor region 104 in the surface direction of the semiconductor substrate 100 exhibits a wave-like distribution that represents the uneven concentration in the perpendicular direction of the semiconductor substrate 100. Each of the unit layers (the layers L1 through L6) includes low-concentration portions that have lower activated doping concentration and high-concentration portions that have high activated doping concentration between two low-concentration portions. That is, in each of the unit layers (the layers L1 through L6) in each of the second semiconductor regions 104, one high-concentration portion is sandwiched between two low-concentration portions. In this stack structure, each of the unit layers (the layers L1 through L6) are repeatedly formed in the perpendicular direction (the Y-direction) of the semiconductor substrate 100.

In each of the unit layers (the layers L1 through L6), the width Wn of the first semiconductor region 102 in the X-direction is the smallest at the center point in the depth direction between a boundary $b_i$ and a boundary $b_{i+1}$, and is the greatest in the depth direction of the boundary $b_i$ and the boundary $b_{i+1}$, except for the unit layer (hereinafter referred to as "the first unit layer") (the layer L1) including the first junction plane B on the side (drain electrode side) of the semiconductor substrate 100. For example, the width Wn of the unit layer (the layer L2) in the first semiconductor region 102 in the X-direction is the smallest at the center point in the depth direction between the boundary b1 and the boundary b2, and is the greatest in the depth direction of the boundary b1 and the boundary b2.

As shown in FIG. 5(A), in each of the unit layers (the layers L1 through L6), the width Wp of each second semiconductor region 104 in the X-direction is the greatest at the center point of the depth between the boundary $b_i$ and the boundary $b_{i+1}$, and is the smallest at the depth of the boundary $b_i$ and the boundary $b_{i+1}$, except for the first unit layer (the layer L1). For example, the width Wp of the unit layer (the layer L2) of each of the second semiconductor region 104 in the X-direction is the greatest at the center point in the depth direction between the boundary b1 and the boundary b2, and is the smallest in the depth directions of the boundary b1 and the boundary b2.

Furthermore, the activated doping concentration in each of the second semiconductor regions 104 on the boundary bi is lower than the activated doping concentration at the center portion between the boundary bi and the boundary bi+1. Each of the first and second semiconductor regions 102 and 104 is divided into the unit layers (the layers L1 through L6) by the thickness of the portion between two low-concentration portions sandwiching one high-concentration portion in each of the second semiconductor regions 104 in a perpendicular direction of the semiconductor substrate 100.

As shown in FIG. 5(B), in each of the unit layers (the layers L1 through L6), the difference between the doping concentration in the second semiconductor regions 104 and the doping concentration in the first semiconductor region 102 is 0 or larger in the depth direction of the boundary $b_i$ on the side (drain electrode side) of the semiconductor substrate 100, and is the largest at the center point of depth between the boundary $b_i$ and the boundary $b_{i+1}$.

As a result, as shown in FIG. 5(C), with respect to the charge quantity of each of the unit layers (the layers L1 through L6), the difference $\Delta Q$ between the charge quantity Qp of the second semiconductor regions 104 and the charge quantity Qn of the first semiconductor region 102 is 0 or larger ($\Delta QB \geqq 0$) in the first unit layer (the layer L1), and becomes larger in the direction from the first unit layer (the layer L1) toward the unit layer (hereinafter referred to as the second unit layer) (the layer L6) including the second junction plane T on the opposite side (source electrode side) from the first junction plane B in each of the unit layers (the layers L1 through L6) stacked in the perpendicular direction (the Y-direction) of the semiconductor substrate 100 ($\Delta QB < \Delta QT$).

An example of a method for manufacturing the semiconductor device shown in FIG. 5(A) will be described below. An n-type semiconductor layer is first formed on the semiconductor substrate 100. Then, a step of implanting n-type impurities and p-type impurities, and a step of epitaxially growing an n-type region thereon are selectively repeated several times. When the n-type diffusion layers and the p-type diffusion layers of the respective unit layers (the layers L1 through L6) are formed, doping concentration is arbitrarily selected. Alternatively, the step of implanting the n-type impurities may be omitted, and the step of implanting the p-type impurities into an n-type epitaxial layer and the step of epitaxially growing an n-type region thereon may be repeated several times.

Figure 6:
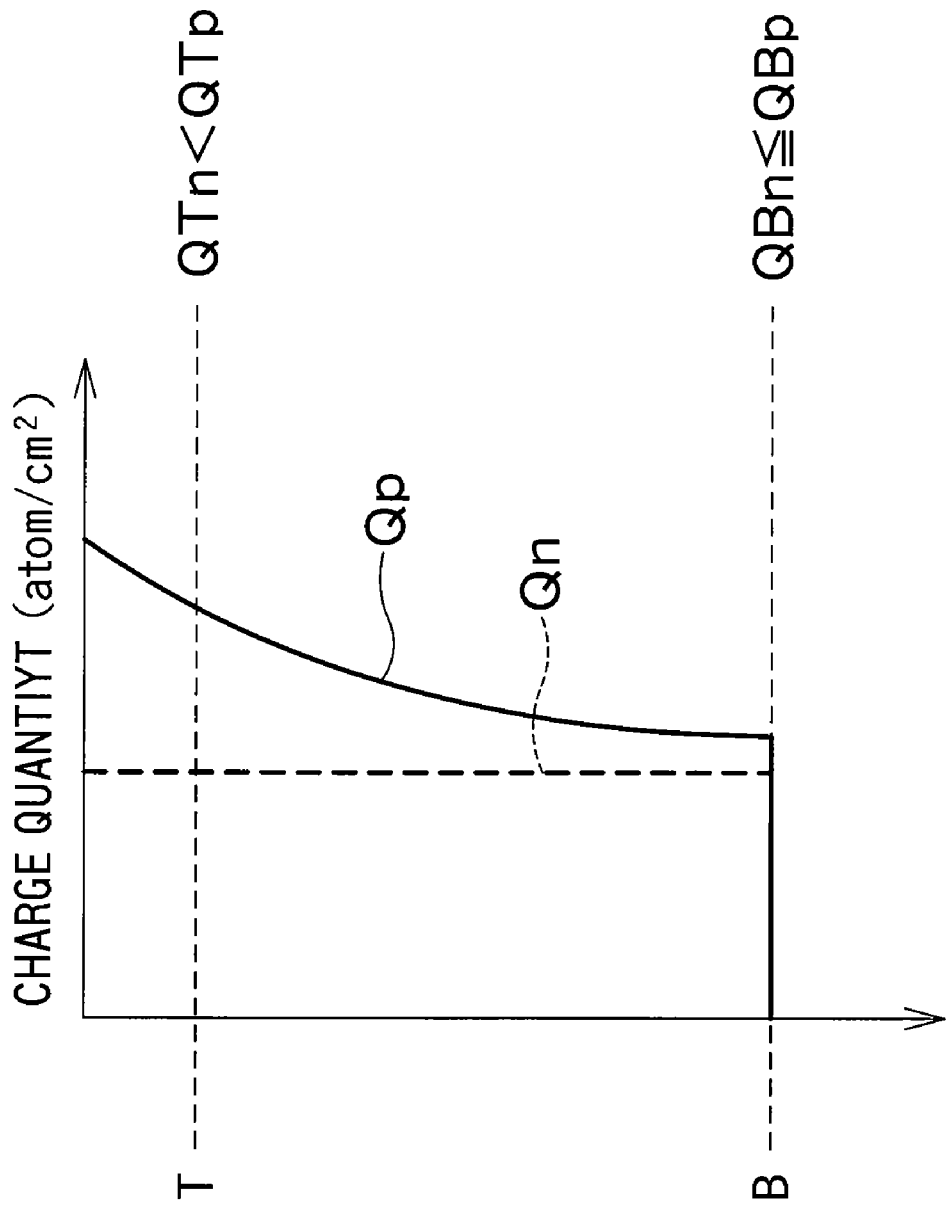
FIG. 6 is a graph showing the relationship between the net charge quantity Q (atoms/cm$^2$) and the depth of the semiconductor device according to another modification of the embodiment of the present invention.

In the above described embodiment of the present invention, the charge quantities Qn and Qp of the first and second semiconductor regions 102 and 104 exhibit linear characteristics from the depth of the first junction plane B toward the depth of the second junction plane T in the perpendicular direction (the Y-direction) of the semiconductor substrate 100. Alternatively, as shown in FIG. 6, at least one of the charge quantities Qn and Qp of the first and second semiconductor regions 102 and 104 may have nonlinear characteristics.

In the above described embodiment of the present invention, the repetitive pitch (the distance between each of two second semiconductor regions 104) in the first semiconductor region 102 and the second semiconductor regions 104 is fixed. Therefore, (WBp+WBn) is always equal to (WTp+WTn).

Although the cross-section of the semiconductor device has been shown in the above described embodiment of the present invention, the profile of the pn structure may extend (in a striped pattern) or the p-type regions may exist in a dotted pattern with respect to the n-type layers, in the perspective direction (not shown).

In the above described embodiment of the present invention, the semiconductor substrate 100 contains silicon. However, the material of the semiconductor substrate 100 is not limited to the above described one, and the semiconductor substrate 100 may contain SiC, GaN, or the like.

In the above described embodiment of the present invention, the semiconductor device is a longitudinal semiconductor device having a source-drain structure. However, the structure and the shape of the semiconductor device is not limited to the above described one, and the present invention may be applied to various kinds of semiconductor devices having high withstand voltage such as 10 V through 1000 V or more.

According to the embodiment of the present invention, the electric field peak appears at the depth of the first junction plane B, and the avalanche point becomes farther away from the gate electrode 114. Therefore, the avalanche capability can be improved, and the device reliability can become higher.

Furthermore, according to the embodiment of the present invention, the feedback current flowing through the gate electrode 114 at the time of switching operation is restricted. Therefore, the noise generated at the time of switching operation can be reduced.

According to the embodiment of the present invention, the difference $\Delta Q$ between the charge quantity Qp of the second semiconductor regions 104 and the charge quantity Qn of the first semiconductor region 102 is 0 or larger at the depth of the first junction plane B, and only the electric field at the deep portion in the drift region becomes higher. Therefore, the avalanche capability can be improved further.

Furthermore, according to the embodiment of the present invention, the ON resistance of the semiconductor device can be reduced if the difference $\Delta Q$ between the charge quantity Qp of the second semiconductor regions 104 and the charge quantity Qn of the first semiconductor region 102 is substantially 0 in the vicinity of the depth of the first junction plane B. That is, the charge quantity Qp of the second semiconductor regions 104 becomes smaller, the ON resistance of the semiconductor device becomes smaller.

What is claimed is:

1. A semiconductor device comprising:
a semiconductor substrate of a first conductivity type;
a first semiconductor region of the first conductivity type on the semiconductor substrate; and
a plurality of second semiconductor regions of a second conductivity type disposed separately in the first semiconductor region in a surface direction of the semiconductor substrate, wherein
a difference between a charge quantity expressed by an integral value of a net activated doping concentration in the second semiconductor regions in the surface direction of the semiconductor substrate and a charge quantity expressed by an integral value of a net activated doping concentration in the first semiconductor region in the surface direction of the semiconductor substrate is always a positive quantity and becomes larger from the depth of the first junction plane to a depth of a second junction plane on an opposite side from the first junction plane of the junction planes at both ends in each second semiconductor region.

2. The device of claim 1, wherein
a width of each second semiconductor region in the surface direction of the semiconductor substrate has a fixed value in a perpendicular direction of the semiconductor substrate, and
the activated doping concentration in each second semiconductor region increases from the depth of the first junction plane to the depth of the second junction plane in the perpendicular direction of the semiconductor substrate.

3. The device of claim 1, wherein
a width of each second semiconductor region in the surface direction of the semiconductor substrate spread from the depth of the first junction plane to the depth of the second junction plane in the perpendicular direction of the semiconductor substrate, and
the activated doping concentration in each second semiconductor region has a fixed value.

4. The device of claim 1, wherein
the first semiconductor region and the plurality of the second semiconductor regions respectively comprise stack structures of a plurality of unit layers,
the charge quantity of the first semiconductor region and the charge quantity of each second semiconductor region respectively exhibit a wave-like distribution representing an uneven concentration in the perpendicular direction of the semiconductor substrate,
the charge quantity of each unit layer in the first semiconductor region comprises two high-concentration portions and a low-concentration portion between the high-concentration portions,
the charge quantity of each unit layer in each second semiconductor region comprises two low-concentration portions and a high-concentration portion between the low-concentration portions, and
a difference between the charge quantity of the high-concentration portion in each unit layer in each second semiconductor region and the charge quantity of the low-concentration portion in each unit layer in the first semiconductor region is always a positive quantity and becomes larger from a unit layer in the first junction plane to a unit layer in the second junction plane.

5. The device of claim 4, wherein
the charge quantity of the high-concentration portion in each unit layer in the second semiconductor region becomes larger from the depth of the first junction plane to the depth of the second junction plane.

6. A semiconductor device comprising:
a semiconductor substrate of a first conductivity type;
a first semiconductor region of the first conductivity type on the semiconductor substrate; and
a plurality of second semiconductor regions of a second conductivity type disposed separately in the first semiconductor region in a surface direction of the semiconductor substrate, wherein
a difference between a charge quantity expressed by an integral value of a net activated doping concentration in the second semiconductor regions in the surface direction of the semiconductor substrate and a charge quantity expressed by an integral value of a net activated doping concentration in the first semiconductor region in the surface direction of the semiconductor substrate is substantially 0 in the vicinity of a depth of a first junction plane on a side of the semiconductor substrate of junction planes at both ends in each second semiconductor region, is always a positive quantity, and becomes larger from the depth of the first junction plane to a depth of a second junction plane on an opposite side from the first junction plane of junction planes at both ends in each second semiconductor region.

7. The device of claim 6, wherein
a width of each second semiconductor region in the surface direction of the semiconductor substrate has a fixed value in a perpendicular direction of the semiconductor substrate, and
the activated doping concentration in each second semiconductor region increases from the depth of the first junction plane to the depth of the second junction plane in the perpendicular direction of the semiconductor substrate.

8. The device of claim 6, wherein
a width of each second semiconductor region in the surface direction of the semiconductor substrate spread from the depth of the first junction plane to the depth of the second junction plane in the perpendicular direction of the semiconductor substrate, and
the activated doping concentration in each second semiconductor region has a fixed value.

9. The device of claim 6, wherein
the first semiconductor region and the plurality of the second semiconductor regions respectively comprise stack structures of the plurality of unit layers,
the charge quantity of the first semiconductor region and the charge quantity of each second semiconductor region respectively exhibit a wave-like distribution representing an uneven concentration in the perpendicular direction of the semiconductor substrate,
the charge quantity of each unit layer in the first semiconductor region comprises two high-concentration portions and a low-concentration portion between the high-concentration portions,
the charge quantity of each unit layer in each second semiconductor region comprises two low-concentration portions and a high-concentration portion between the low-concentration portions, and
a difference between the charge quantity of the high-concentration portion in each unit layer in each second semiconductor region and the charge quantity of the low-concentration portion in each unit layer in the first semiconductor region is always a positive quantity and becomes larger from a unit layer in the first junction plane to a unit layer in the second junction plane.

10. The device of claim 9, wherein
the charge quantity of the high-concentration portion in each unit layer in the second semiconductor region becomes larger from the depth of the first junction plane to the depth of the second junction plane.

* * * * *